United States Patent [19]

Yamabe et al.

[11] Patent Number: 5,431,561
[45] Date of Patent: Jul. 11, 1995

[54] METHOD AND APPARATUS FOR HEAT TREATING

[75] Inventors: Kikuo Yamabe, Yokohama; Keitaro Imai, Kawasaki; Katsuya Okumura, Yokohama; Ken Nakao, Sagamihara; Seikou Ueno, Mizusawa, all of Japan

[73] Assignees: Kabushiki Kaisha Toshiba, Kawasaki; Tokyo Electron Sagami Limited, Kanagawa, both of Japan

[21] Appl. No.: 166,014

[22] Filed: Dec. 14, 1993

Related U.S. Application Data

[62] Division of Ser. No. 799,931, Nov. 29, 1991, Pat. No. 5,297,956.

[30] Foreign Application Priority Data

Nov. 30, 1990 [JP] Japan .................................. 2-340622
Nov. 8, 1991 [JP] Japan .................................. 3-292725

[51] Int. Cl.⁶ .................................................. F27D 5/00
[52] U.S. Cl. ........................................ 432/253; 432/152
[58] Field of Search ............... 432/5, 6, 241, 11, 152, 432/253

[56] References Cited

U.S. PATENT DOCUMENTS

| | | | |
|---|---|---|---|
| 4,802,842 | 2/1989 | Hirayama | 432/253 |
| 4,938,691 | 7/1990 | Ohkase et al. | 432/253 |
| 5,054,418 | 10/1991 | Thompson et al. | 432/253 |
| 5,055,036 | 10/1991 | Asano et al. | 432/241 |
| 5,221,201 | 6/1993 | Yameja et al. | 432/253 |

*Primary Examiner*—Andrew M. Dolinar
*Attorney, Agent, or Firm*—Oblon, Spivak, McClelland, Maier & Neustadt

[57] ABSTRACT

A method and an apparatus for heat treating in a heat treating apparatus having a heating chamber to be introduced with predetermined gas, a heater disposed around the heating chamber, and jigs disposed in the heating chamber for supporting wafers of a plurality of substrates to be treated in parallel with each other, wherein in order to make the temperature distribution of the wafers of the substrates to be treated in the radial direction uniform in the heat treatment, the jigs are formed to determine the sizes and the shape thereof in predetermined ranges having a gradient according to the heat treating method having a predetermined shape determining procedure so that the jigs are formed in ring-shaped trays (i.e. support-ring) for holding at the peripheries the substrates to be treated and the thickness of the tray is constant or such that the outer peripheral side thereof is thicker than the inner peripheral side thereof.

2 Claims, 16 Drawing Sheets

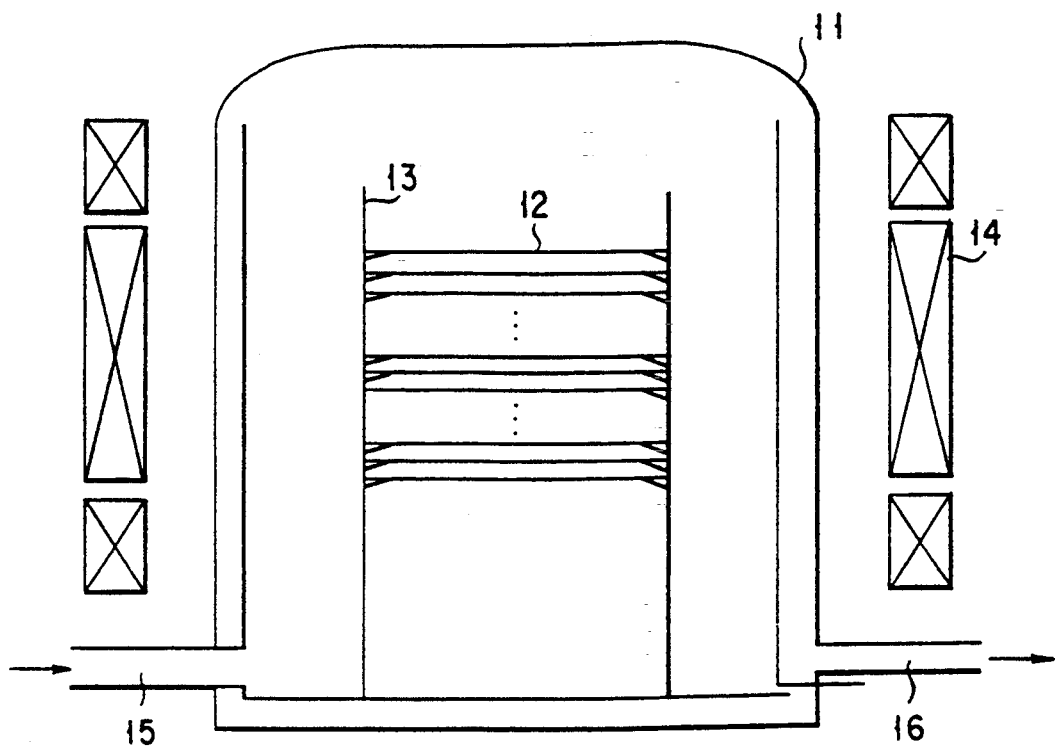
F I G. 1
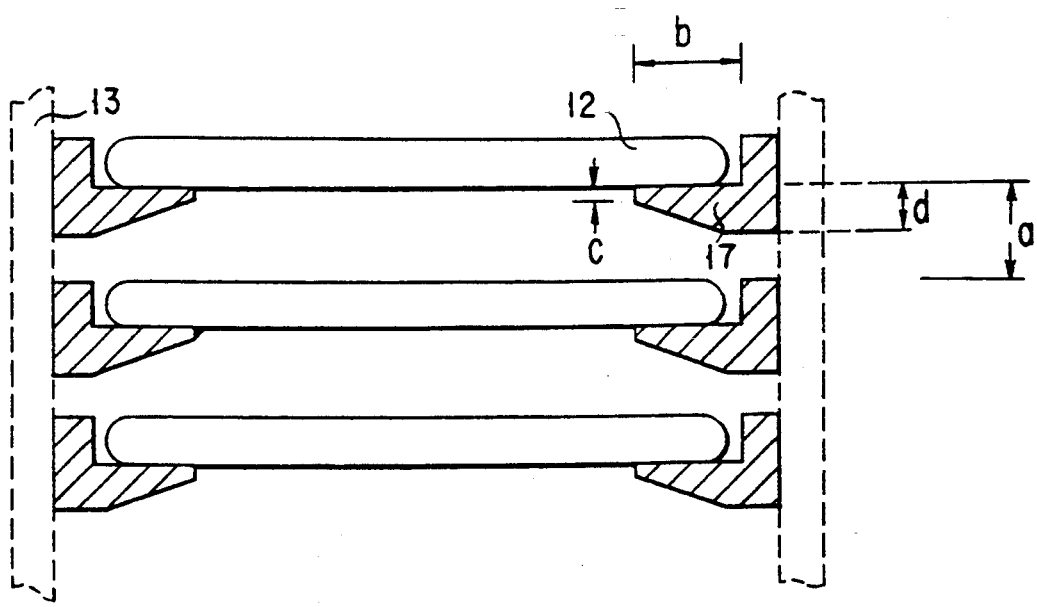
F I G. 2

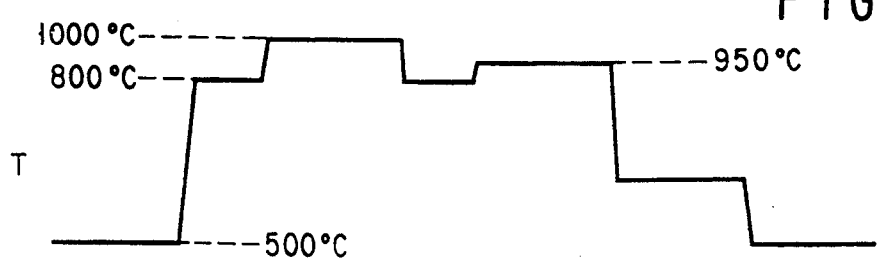
FIG. 3A
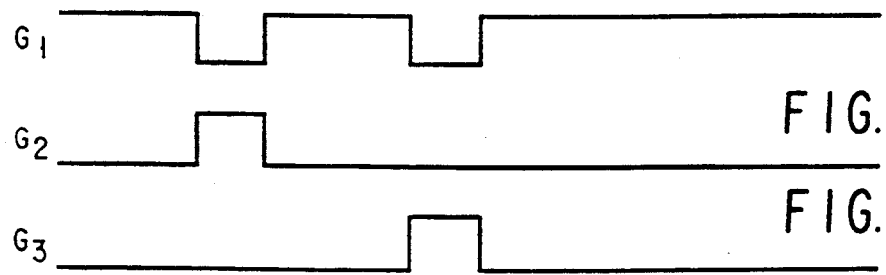
FIG. 3B
FIG. 3C
FIG. 3D
TIME →

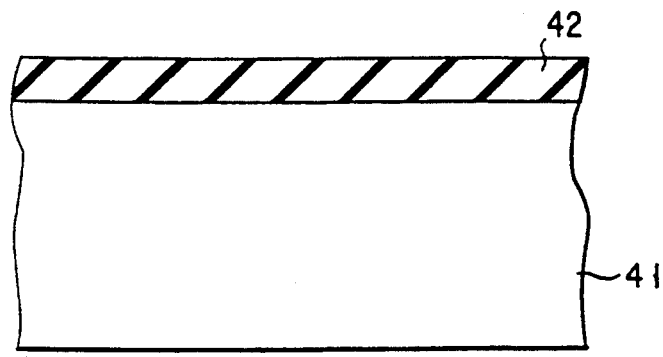
F I G. 4 A
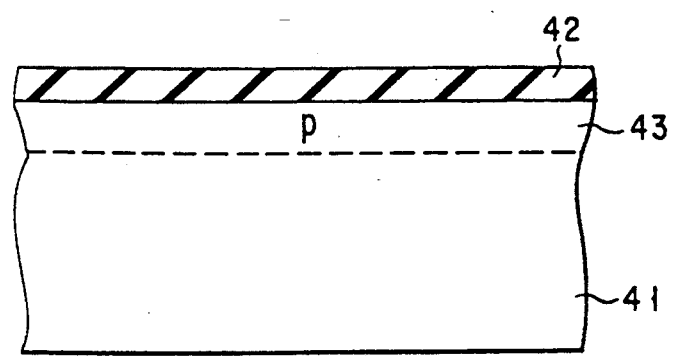
F I G. 4 B
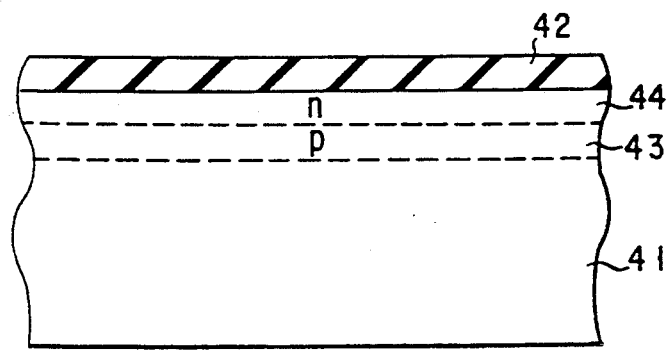
F I G. 4 C

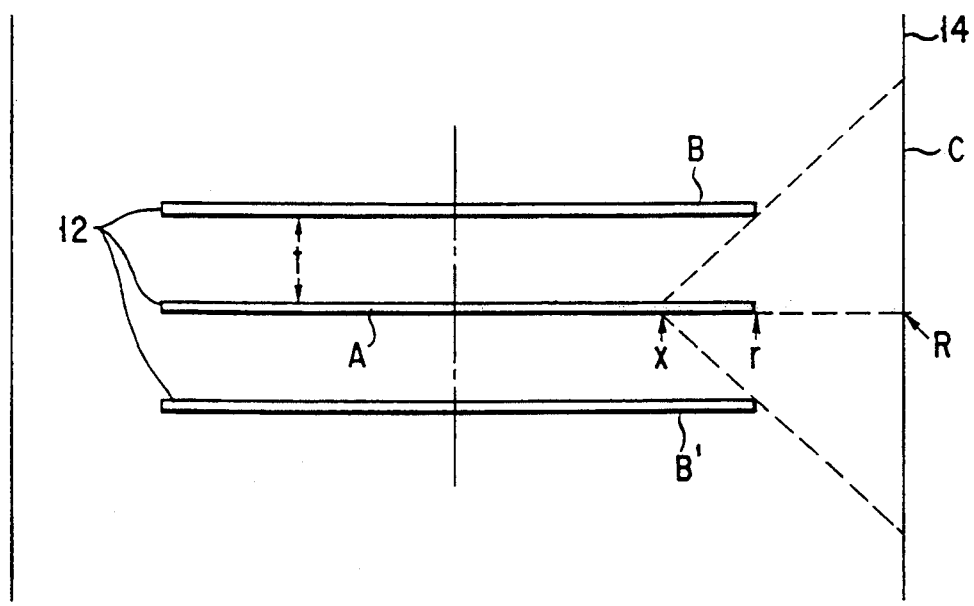
F I G. 5

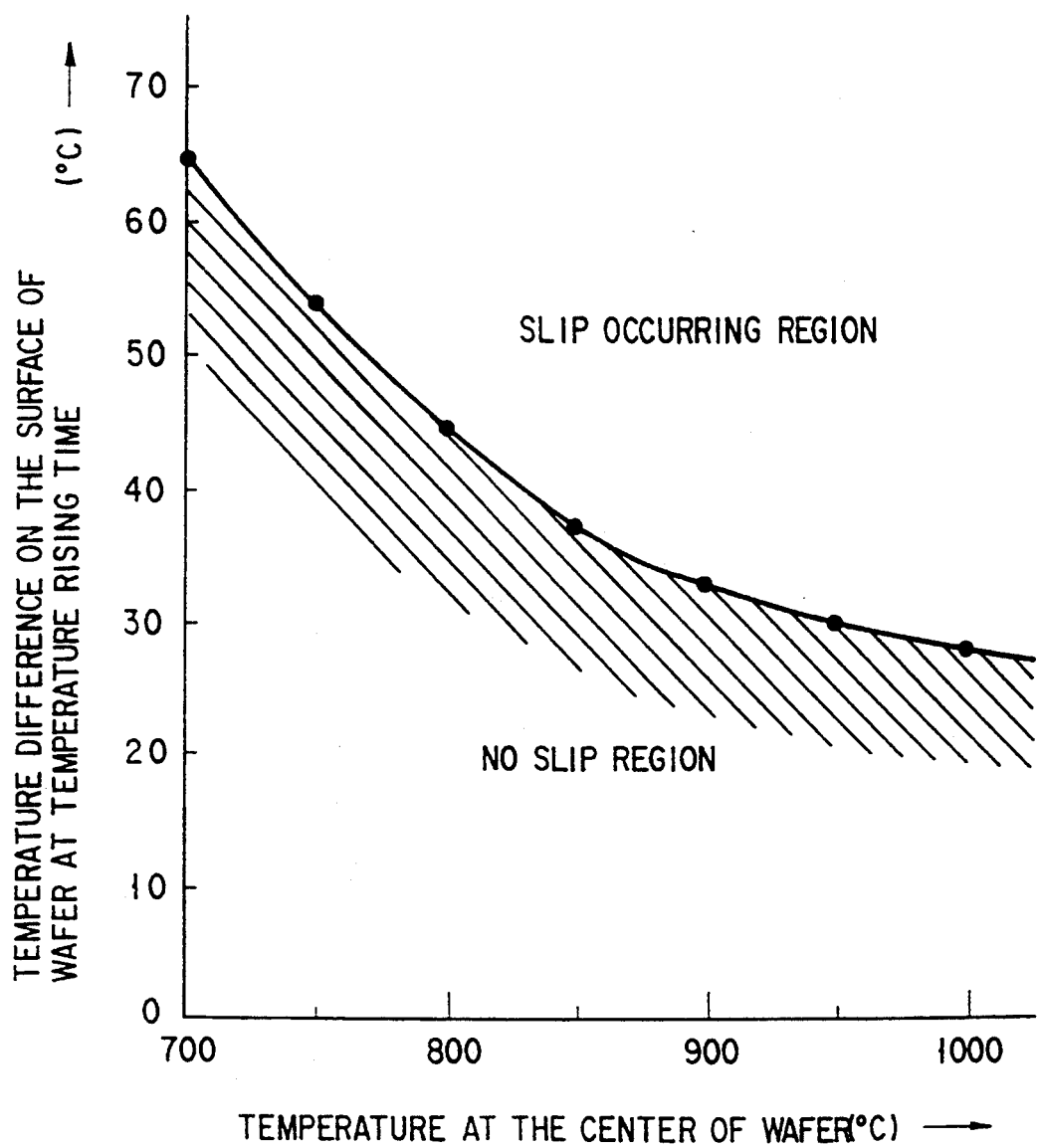
F I G. 11

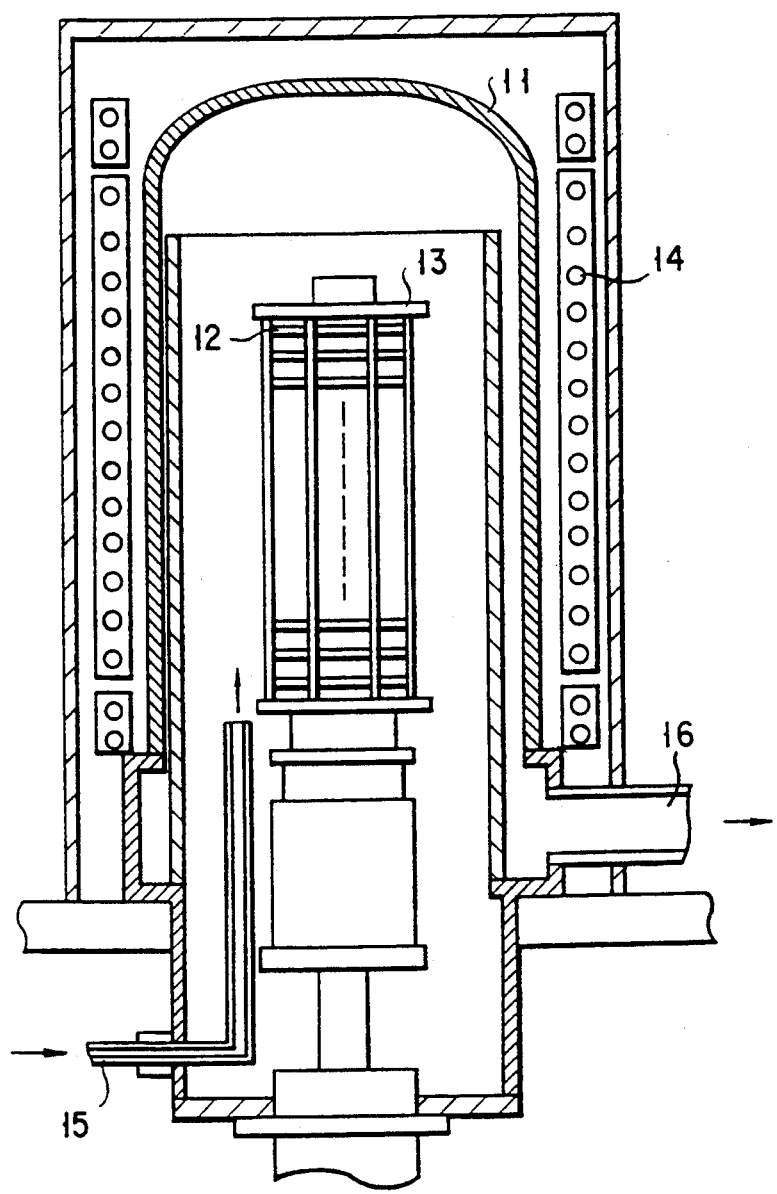
F I G. 16

METHOD AND APPARATUS FOR HEAT TREATING

This is a division of application Ser. No. 07/799,931, filed on Nov. 29, 1991, now U.S. Pat. No. 5,297,956.

BACKGROUND OF THE INVENTION

1. Field of the Invention

The present invention relates to a method and an apparatus for heat treating a semiconductor wafer or a glass substrate.

2. Description of the Related Art

Heretofore, in order to form a diffused layer, a silicon oxide film or a silicon nitride film on a semiconductor wafer or a glass substrate, various types of heat treating apparatuses are employed. In general, in these apparatuses, a substrate to be heat treated is heat treated by heating the substrate to be heat treated, contained in a reaction vessel (i.e., a heating chamber) and introducing "inert gas" or "reactive gas" or "reactive gas" into the vessel.

The following conditions are required as performances of the heat treating apparatus:

(1) The resistance and the depth of a diffused layer to be formed and the thicknesses of a silicon oxide film, a silicon nitride film are uniform on the surfaces of wafers and between the wafers, and its reproducibility is high.

(2) No "slip" or "warpage" occurs in the wafer due to "thermal distortion" caused by a temperature difference.

(3) A large quantity of wafers can be treated per one operation.

(4) Treating time per one operation is short.

(5) When substrates to be treated are conveyed in or out of the vessel, no air is simultaneously introduced into the substrate, and no oxide film is grown on the surface of the substrate to be treated due to the air.

Heretofore, a configuration in which a heat insulator is mounted at the periphery of a heater or a linear tube made of silicon carbide is provided between a heater and a process tube has been frequently employed so as to enhance the uniformity of temperatures in the steps of oxidizing and heat treating at high temperatures near 1,000° C. in a semiconductor integrated circuit device. When a semiconductor wafer is heat treated at high temperatures by using the above-described semiconductor heat treating apparatus, it frequently occurs to mix the air at the same time in the case of conveying the semiconductor wafer into or out of a vessel. Therefore, an oxide film is formed in an atmosphere which is not controlled. As a result, the uniformity of a film or a diffused layer formed by the heat treatment at high temperatures might be deteriorated or the quality of the film might be lowered. In order to prevent the malfunction of the above-described treatment, the following method is employed. That is, a method having the steps of lowering temperatures at the time of inserting a semiconductor wafer into a vessel, extracting the mixed air with gas having high purity such as nitrogen, argon or oxygen, then heating it to high temperatures, lowering the temperature after the heat treatment, and then removing the semiconductor wafer is employed.

However, when a heat treating apparatus having a heat source of large heat capacity is employed for the above-described method, it takes a plenty of time to oxidize at a desired temperature and to rise and fall the temperatures before and after the steps except the heat treatment, resulting in a decrease in productivity or disabling the depth of an impurity diffused layer to be held shallow. If the semiconductor wafer is abruptly removed from the vessel to be cooled after it is oxidized or heat treated, a large temperature difference occurs on the surface of the semiconductor wafer, and a slip occurs or a warpage occurs to be deformed.

As a method of solving the above-described problems, a heat treating apparatus in which a heater is wound on the outer periphery of a quartz process tube, the outer periphery of the process tube is covered with a high reflection film to reduce the heat capacity of a heat source, and "temperature rising and falling velocities" are high is proposed. However, if the maximum output of the heater is intended to be improved to the degree capable of heat treating at high temperatures in the apparatus of this configuration, its heat capacity is increased, and its temperature falling velocity is lowered. In comparison with the conventional heat treating apparatus in which the temperature rising and falling velocities are about 10° C. per min., about 2° to 3° C. per min., respectively, the temperature rising and falling velocities of the improved apparatus are 30° C. per min., of relatively high performance are obtained, but this value is not still sufficiently high.

As the other method, a method having the steps of contacting a substrate to be treated with "a heater" made of carbon installed in a vessel and rising its temperature by means of induction heating has been known. However, according to this method, since the substrate to be treated is contacted with the heater, the volume of the vessel is increased. As a result, it was disadvantageous to treat the substrate to be treated of a large diameter. Further, a method disclosed in Unexamined Published Japanese Patent Application No. 61-191015, i.e., a method having the steps of mounting a heater in a vessel, disposing semiconductor wafers at a predetermined interval horizontally in the heater, and heating the wafers by a heat source provided out of the vessel has been proposed. However, according to this method, if the distance between the heat source and the substrate to be treated is near and the diameter of the substrate to be treated is large, there arises a problem in which its temperature distribution occurs in the radial direction of the substrate to be treated.

In principle, the substrate to be treated by heat in such a manner that heat rays radiated from a heater are absorbed by the substrate to be treated. However, if a plurality of substrates to be treated are mounted perpendicularly to the heater, when the heating velocity of the heater is set to a large value so as to accelerate the temperature rising velocity, the plurality of substrates to be heated mounted in parallel with each other form shades to each other. Therefore, the temperature change of the periphery of the substrate to be treated becomes faster than that of the center of the substrate at the temperature rising and falling times. As a result, it was difficult to make the radial temperature distribution of the substrate to be treated uniform.

As described above, in order to heat treat a large number of wafers at once (in a batch type), it is desirable to mount a plurality of wafers in parallel with each other perpendicularly to a heater in a reaction vessel. However, according to the conventional method, when the wafers are "abruptly heated or cooled" and further "unloaded", a temperature difference occurs in the radial direction of the wafer, causing a slip or a crystal defect to occur due to thermal distortion or the wafer to be warped. If the wafer of large diameter such as 8 inches or larger is treated, a large temperature distribution difference occurs on the surface of the wafer (particularly in the radial direction). Therefore, it is difficult to further accelerate "the temperature rising velocity" and "the temperature falling velocity" due to causes of malfunctions.

SUMMARY OF THE INVENTION

Accordingly, it is a primary object of the present invention to provide a method and an apparatus for heat treating substrates to be treated (e.g., wafers) in which a temperature difference in each substrate to be treated (e.g., a wafer), occurring when a plurality of substrates mounted in parallel with each other perpendicularly to a heater are risen or fallen at temperatures to prevent a slip, a crystal defect and a warpage from occurring due to thermal distortion.

The subject of the present invention is to reduce a temperature difference in the radial direction of a substrate to be treated at the temperature rising and falling times by providing a difference of heat capacity in the radial direction of the substrate to be treated.

More specifically, according to one aspect of the present invention, there is provided a method of heat treating a plurality of substrates to be treated by mounting the substrates in parallel with each other in a region surrounded by a heater, comprising the step of determining the material and the shape of each of the substrates to be treated according to a predetermined method so as to increase the total heat capacity of the peripheries of the substrates and a jig for supporting the substrates larger than that of the centers thereof.

According to another aspect of the present invention, there is provided an apparatus for heat treating a plurality of substrates to be treated, comprising a heating chamber to be introduced with predetermined gas, a heater disposed around said heating chamber, and a jig disposed in said heating chamber for supporting the plurality of substrates to be treated in parallel with each other, wherein said jig is formed of a material in shape to be obtained by a predetermined method so that the heat capacity of the outside of the substrate to be treated is larger than that of the inside thereof in the radial direction of the substrate to be treated.

There are the following preferable embodiments (1) to (4) of the present invention when the material of the jig is formed of, for example, quartz.

(1) The heat capacity of the outside of the substrate to be treated and the jig for supporting the substrate is larger than the inside thereof in the vicinity of the periphery of the substrate.

(2) The jig for supporting the substrate to be treated is formed of a ring-shaped tray (so called support-ring), and the thickness of the inner peripheral side of said tray is formed larger than that of the outer peripheral side thereof. More specifically, the thickness of the tray is larger at the outside at a predetermined gradient, or the thickness of the outside of the tray is formed larger at a stepwise variation.

(3) The jig for supporting the substrate to be treated is formed in a ring-shaped tray (so called support-ring), the tray is formed of a plurality of types of materials, and the specific heat of the material of the outer peripheral side of the substrate to be treated is formed to be larger than that of the inner peripheral side thereof.

The following operations are obtained by the above-described embodiments of the present invention.

When the temperature of the substrate to be treated is varied by rising the temperature of the heater in the heating chamber surrounded by the heater, the substrate to be treated is heated mainly by means of the radiation of the heater. In this case, if the heater is a predetermined temperature, the quantity of heat of the substrate to be heated depends upon the distances between the points of the substrate to be heated and the points of the heater.

For example, it is assumed, for example, that the substrates are mounted in parallel with each other. As shown in FIG. 5, the points of a substrate A cannot be radiated from all the points of a heater C since the substrate A is shielded by adjacent substrates B and B' to be treated. Therefore, the substrates to be treated, mounted in parallel in the heater are radiated by more quantity of radiation heat at the peripheries thereof and previously heated at the peripheries thereof as shown in FIG. 6, and the temperature distribution in the radial direction of the substrates to be treated becomes irregular.

However, even if the substrates are radiated by the same quantities of radiation heat, it is general that, the larger the heat capacity is, the temperature rising rate is small, while the smaller the heat capacity is, the temperature rising rate is large. Therefore, the fact that the periphery of the substrate becomes higher temperature than the center thereof can be suppressed at the heating time by forming so that the total heat capacity of the substrate to be treated and the jig for supporting the substrate is different in the radial direction of the substrate to be treated particularly in such a manner that the heat capacity of the periphery of the substrate to be treated is larger than that of the center thereof according to the present invention.

Even when the heater C is fallen at its temperature to proceed heat radiation from the substrate to be treated to be cooled, the operation can be considered similar to the above. More specifically, heat is generally radiated from the points of the substrate A to be treated at the temperature falling time. Particularly, if the substrates to be treated are mounted in parallel with each other, the substrates B and B' to be treated adjacent to the substrate A to be treated are radiated by the radiation heat from the substrate A to be treated simultaneously when the heat is radiated from the substrate A to be heated. The heat radiation efficiency of the center of the substrate to be treated is lowered by the influence to lower the temperature falling velocity thereof. On the other hand, the quantity of the radiation heat of the periphery of the substrate A to be treated out of the heater which has been lowered at its temperature is increased. Therefore, the temperature falling velocity of the periphery of the substrate A to be treated is raised. As a result, the radial temperature distribution of the substrate to be treated becomes irregular.

However, generally, even if the same quantities of the radiation heats are radiated from the periphery and the center of the substrate to be treated, if the heat capacity is larger, the temperature fall is reduced. Therefore, similar to the above-described temperature rising time, the temperature falling velocity is suppressed by forming the substrate to be treated such that the heat capacity of the periphery having higher radiation efficiency than the center of the substrate to be treated becomes larger. As a result, the fact that the temperature of the periphery of the substrate to be treated is periphery of the substrate to be treated is previously lowered can be suppressed.

As described above, it is effective in enhancement of the uniformity of the temperature distribution of the uniformity of the temperature distribution of the substrate to be treated at both temperature rising and falling times to provide jigs having different heat capacities in the radial direction of the substrate to be treated at a plurality of substrates to be treated mounted in parallel with each other in the heating chamber covered by the heater. According to the present invention, the substrates to be treated can be heat treated at high temperatures such as 1,000° C. or higher, and the temperature rising and falling velocities can be increased by suppressing the temperature difference of the substrate to be treated in the radial direction of the substrate. For example, desired high temperature heat treatment can be performed by suppressing the increase in the diffusion depth of the impurity diffused region formed in a semiconductor wafer as much as possible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a sectional view showing the general arrangement of a heat treating apparatus according to an embodiment of the present invention;

FIG. 2 is a sectional view showing the structure of a ring-shaped tray (i.e. support-ring) used for the embodiment of the apparatus;

FIG. 3 is a diagram showing relationship between a heating timing and gas supplying timing;

FIGS. 4A to 4C are sectional views showing the steps of forming a diffused layer by the embodiment of the apparatus;

FIG. 5 is a schematic view showing the state of heat radiation from a heater to a wafer;

FIG. 11 is a diagram of lower limits of temperature difference on the surface of a wafer where a slip occurs to be plotted as a function of its central temperature;

FIG. 16 is a detail sectional view showing the actual arrangement of a heat treating apparatus.

DETAILED DESCRIPTION OF THE PREFERRED EMBODIMENTS

Figure 6:
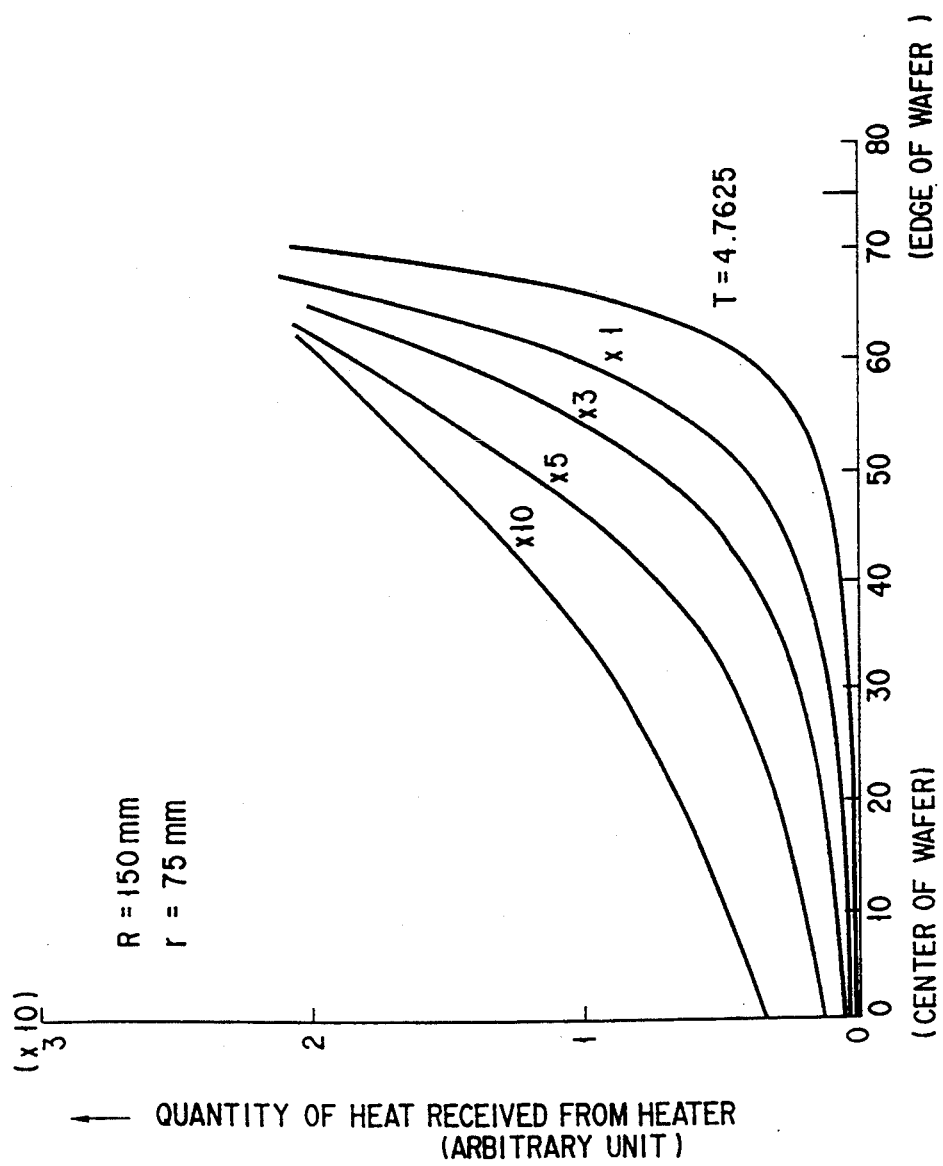
FIG. 6 is a characteristic diagram showing temperature dependency of the wafer by the calculated result of radiation heat.

FIG. 1 shows a general sectional view of an arrangement of a heat treating apparatus according to an embodiment of the present invention. FIG. 16 is a detail sectional view showing the actual arrangement of a heat treating apparatus. In FIG. 1, in a quartz tube 11 for constituting a heating chamber, a quartz boat 13 for containing a plurality of semiconductor wafers 12 as substrates to be treated is disposed. Heaters 14 are mounted, for example, coaxially with the quartz tube 11 around the quartz tube 11 in parallel with the longitudinal direction of the quartz tube 11. In order to improve temperature uniformity in the circumferential direction of the wafers 12, the boat 13 may be rotated by a motor (not shown) to rotate the wafers 12 themselves. Predetermined gas is introduced through an inlet 15 into the quartz tube 11, and exhausted through an exhaust port 16.

As shown in an enlargement in FIG. 2, a plurality of ring-shaped trays (i.e. support-ring) 17 are arranged as jigs for supporting the wafers 12 in the boat 13 indicated by broken lines in FIG. 2. A plurality of wafers 12 are placed on the trays 17, and supported in parallel with each other. Each tray 17 is formed such that the thickness of the portion in contact with the wafer 12 is thicker toward the periphery thereof and thinner toward the inside portion thereof.

Referring to FIG. 3 and FIGS. 4A to 4C, a method of heat treating semiconductor wafers by using the above-described heat treating apparatus (hereinafter referred to as "a heat treatment for forming a diffused layer") will be described.

FIG. 3 is a schematic diagram showing a heating timing and gas supplying timing, and FIGS. 4A to 4C are sectional views showing the steps of manufacturing a diffused layer.

As shown in FIG. 4A, a silicate glass (BAsSG) 41 in which boron (B) of $1 \times 10^{20}$ cm$^{-3}$ and arsenic (As) of $5 \times 10^{20}$ cm$^{-3}$ are added is deposited on a silicon wafer 41 having 6 inches of a diameter. A plurality of the silicon wafers 41 are prepared, and placed as substrates to be treated on ring-shaped trays 17 shown in FIG. 2. After the trays 17 are mounted in a boat 13 of the apparatus shown in FIG. 1, the boat 13 is disposed in the quartz tube 11. Thereafter, B and As diffused layers are simultaneously formed through heating steps to be described later.

More specifically, the boat 13 is introduced into a treating chamber isolated in an atmosphere by the quartz tube 11 which is maintained at a predetermined temperature of about 500° to 700° C. by a heater 14, and the air introduced when the boat 13 is introduced into the chamber is sufficiently substituted for nitrogen in which 10% of hydrogen is added. Then, it is heated by the heater 14 from 500° to 700° C. to 900° C., the As in the silicate glass 42 is once reduced to be treated to be scarcely diffused, then risen at a velocity of 100° C. per min. to 1,000° C. to diffuse the B to the deep region of the silicon wafer 41, thereby forming a B diffused layer 43 as shown in FIG. 4B.

Subsequently, it is lowered at a velocity of 100° C. per min. from 1,000° C. to 900° C., the atmosphere in the chamber is substituted for an atmosphere containing oxygen to convert the As in the silicate glass 42 to an oxide state to facilitate diffusion of the As, and again risen from 900° C. to 950° C. to form an As diffused layer 44 on the surface of the silicon wafer 41 as shown in FIG. 4C.

Eventually, after it is lowered at a velocity of 100° C. per min. to 700° C. or lower, the silicon wafers 41 mounted in the quartz tube 13 are removed from the treating chamber.

As the steps executed as described above, the As and the B are simultaneously diffused in the vicinity of the surface of the silicon wafer 41 to form two diffused layers 43 and 43, i.e., a pn junction having different depth.

In the apparatus shown in FIG. 1 to be executed through a series of steps as described above, when the silicon wafers 12 are risen at temperatures by heating by the heater 14, the wafers 12 are heated mainly by heat radiation from the heater 14. In this case, the quantities of heat of the silicon wafers 12 depends upon distances between the points of the silicon wafer 12 and the points of the heater 14. If the silicon wafers 12 are mounted in parallel with each other, as shown in FIG. 5, the points of the silicon wafer A are not all radiated by the heat radiated from the heater C since the points of the silicon wafer A are shielded by adjacent silicon wafers B and B' to the silicon wafer A. In other words, the adjacent silicon wafers B and B' to the wafer A shut off the heat from the heater C to the wafer A. Therefore, if the ring-shaped trays 17 are not provided, the silicon wafers 12 mounted in parallel with each other in the heater 14 are heated at the peripheries thereof by more quantity of radiation heat than at the centers thereof to be previously heated as shown in FIG. 6. Therefore, the temperature distributions in the radial direction of the wafers 12 become irregular. In the graph in FIG. 6, curves illustrate the results of simulations of the quantities of radiation heat at the distances from the center of the wafer with wafer intervals of 47.625 mm ($\times 10$), 23.3125 mm ($\times 5$), 14.2875 mm ($\times 3$), and 4.7625 mm ($\times 1$), respecting.

However, even if the same quantities of radiation heat are obtained, if the heat capacity is large, its temperature rise is small, while if the heat capacity is small, its temperature rise is large. Therefore, when the ring-shaped tray 17 is mounted at the periphery of the wafer, the heat capacities of the tray 17 including the silicon wafer 12 are different in the radial directions of the tray 17 and the wafer 12, and the heat capacity of the periphery of the wafer 12 is formed to be larger than that of the center thereof, the fact that the periphery of the wafer 12 becomes higher temperature than the center thereof at the temperature rising time can be suppressed.

Therefore, the ring-shaped trays 17 of this embodiment are formed, as shown in FIG. 2, in shape to be contacted with the peripheries of the silicon wafers each having 6 inches of a diameter, mounted in parallel with each other at an interval a of 9.525 mm and having a dimension "b" of 30 mm of width, a dimension "c" of 0.5 mm of thickness at the inner periphery of the tray 17, and a dimension "d" of 4 mm of thickness at the outer periphery thereof, and variable thickness of a predetermined gradient on the way from the inner periphery thereof to the outer periphery thereof.

The following operation and effect are obtained by employing the ring-shaped trays 17 formed of the material in shape as described above. Since the heat capacities of the ring-shaped tray 17 are set larger toward the outer periphery, the temperature difference on the surface of the mounted wafer from the inner periphery thereof to the outer periphery thereof is suppressed to a small value even at the temperature rising and falling times, resulting in no slip and no warpage in the silicon wafer.

Incidentally, if the ring-shaped trays of the embodiment are not employed, it becomes difficult to increase the temperature rising and falling velocities, and the velocities are as low as 5° C. Therefore, the heat treating capacity of the heat treating apparatus was low, it was difficult to enhance the controllability of the diffusing depth of the silicon wafer, and it was difficult to form the As diffused layer in a shallow depth.

In this embodiment, the quartz ring-shaped trays in shape having 30 mm of width, 4 mm of maximum thickness at the peripheries and about 1/10 of the ratio of thicknesses at the inner periphery thereof to those at the outer periphery thereof in the case of an interval of 9.525 mm of the wafers aligned were employed. In this case, the cause for generating a slip depends also upon the delicate shape of the edge of the wafer, the oxygen concentrations between lattices in the silicon wafer, and the maximum temperature to be treated. The shape of the ring-shaped tray may be deformed according to the diameter of the wafer, the thickness of the wafer and the material of the tray, the object can be performed in this manner. It is noted that, even if the ring-shaped trays exceeds the above-described ranges of the setting conditions according to the variation in the delicate shape, they do not depart from the spirit and scope of the present invention. If the decrease in the treating efficiency is allowed, the above-described settings may depart from the above-described ranges by increasing the interval of the wafers, and still do not depart from the spirit and scope of the present invention.

In the embodiment described above, the thickness of the ring-shaped tray has been formed in shape having variable thickness of a predetermined gradient from the inner periphery thereof to the outer periphery thereof. It is effective to provide the variation in the thickness of the ring-shaped tray in shape varying at the ratio according to the calculated curve shown in FIG. 6, but even if the variation in the thickness of the ring-shaped tray employs a predetermined gradient or a stepwise manner, the above-described object of the present invention may also be performed.

In the embodiment described above, the ring-shaped trays 17 for supporting the wafers 12 are formed in thicknesses to be thicker from the inner peripheral side thereof toward the outer peripheral side thereof. Therefore, the heat capacities of the tray 17 are increased from the inner peripheral side thereof toward the outer peripheral side thereof, and the equivalent heat capacities of the wafer 12 can be increased from the inner peripheral side toward the outer peripheral side. Therefore, while the radial temperature distribution of the wafer from the inner periphery thereof toward the outer periphery thereof at the temperature rising and falling times by the heater 14 is made uniform, the temperature rising, and falling velocities of the wafer can be accelerated. Therefore, since its throughput can be increased and a shallow diffused layer can be formed without introduction of a crystal defect, a slip and a warpage of the wafer, it is particularly effective to manufacture semiconductor devices. In comparison with the conventional heat treating apparatus, the embodiment of the heat treating apparatus of the present invention has advantages capable of being simply performed merely by improving the shape of the ring-shaped trays.

The operation of the heat treating apparatus of the embodiment described above employing the ring-shaped tray of the arrangement as described above will be described in more detail.

When a heater is heated to abruptly rise the temperature in a batch type furnace, a plurality of wafers disposed in a space surrounded by the heater disposed perpendicularly to the wafers aligned in parallel with each other therein are, as shown in FIG. 5, shaded to each other by the adjacent wafers of both sides, and the periphery of each wafer is radiated by more radiation heat from the heater than that at the center thereof to become further higher temperature than that at the center thereof. In a conventional furnace, as the diameter of the wafer is increased, the temperature rising velocity is lowered to rise the temperature of the wafer by making the wafer uniform at temperatures from the inner periphery thereof to the outer periphery thereof by means of heat conduction. Therefore, in order to heat treat the wafers of increasing diameter in future at a batch unit, its throughput must be lowered.

In comparison with the uniform temperature by means of heat diffusion in the silicon wafer, if the temperature of the wafer is risen by the quantity of heat received from the heater, the silicon having a mass m and a specific heat C and its support are risen at a temperature $\delta T$ by the quantity of heat of $\delta P$ received by the wafer for extremely short time as below.

$$\delta T = \delta P / mC \quad (1)$$

When its heat capacity is represented by G, G=mC is satisfied, and the equation (1) may be represented by the following equation (2) as below.

$$\delta T = \delta P / G \quad (2)$$

Therefore, when the heat capacities of the silicon and the support are varied in response to the change rate of the quantity of heat received from the heater, the temperature difference on the wafer from the inner periphery thereof to the outer periphery thereof can be suppressed.

Figure 7:
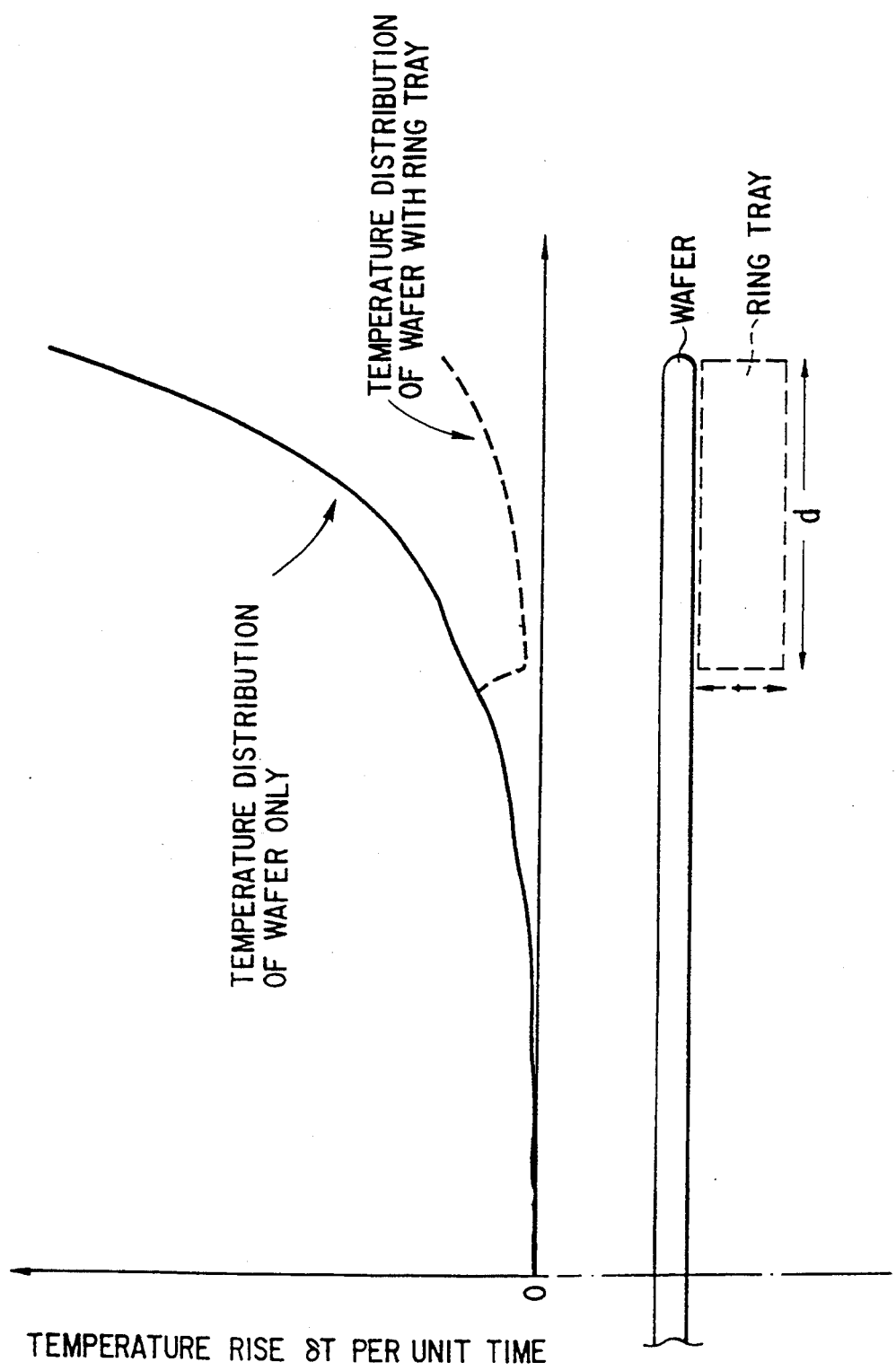
FIG. 7 is a diagram for explaining an effect of a ring-shaped tray on a temperature distribution of a wafer.

FIG. 7 shows a temperature distribution on the surface of the wafer by the quantity of heat received from the heater per unit time. The temperature distribution of only the wafer is represented by a solid curve, while, when a ring-shaped tray is provided at the wafer and its heat capacity is increased, for example, by five times, the temperature of the wafer at the ring tray is lowered substantially by 1/5 to exhibit characteristic as shown by a curve of a broken line in FIG. 7.

Figure 8:
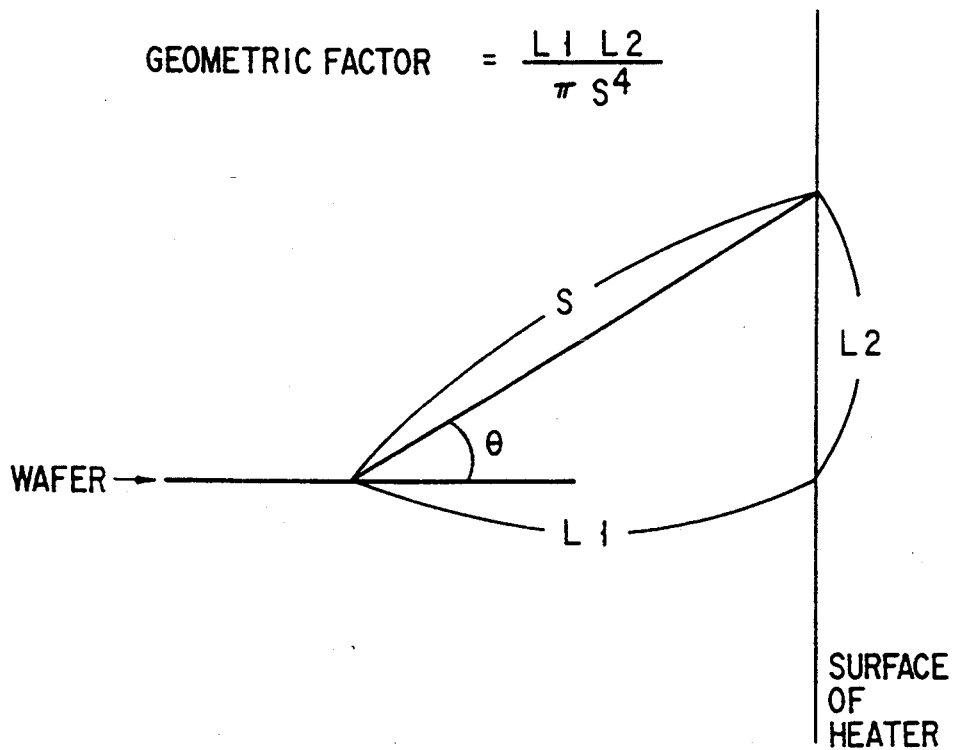
FIG. 8 is a diagram showing positional relationship between a heater and a wafer.

When the quantity of heat $\delta P$ received by the wafer does not depend upon the position on the surface of the wafer at the temperature rising time of the wafer, the temperature of the wafer uniformly rises. However, when the quantity of heat received from the heater in the radial direction of the wafer at the heating time is calculated by simplification in the case where the wafers are disposed in parallel with each other perpendicularly to the heater as shown in FIG. 5, the quantity of heat received from the heater to the wafer at the positions in the radial direction of the wafer becomes as shown by a curve in FIG. 7. In the calculation, the positional relationship between the heater and the wafers is assumed to be as shown in FIG. 8. At this time, its geometric factor is represented as below.

$$L1 \cdot L2 / \pi S^4 \quad (3)$$

The various conditions are set such that the inner radius R of the heater is 150 mm, the radius r of the wafer is 75 mm, and the interval of the wafers is set to 4.7625 mm. It is understood from the curve in FIG. 9 that the quantity of heat received from the heater is abruptly increased in the vicinity of 20 mm from the vicinity of the periphery (edge) of the wafer toward the outer periphery thereof.

Figure 9:
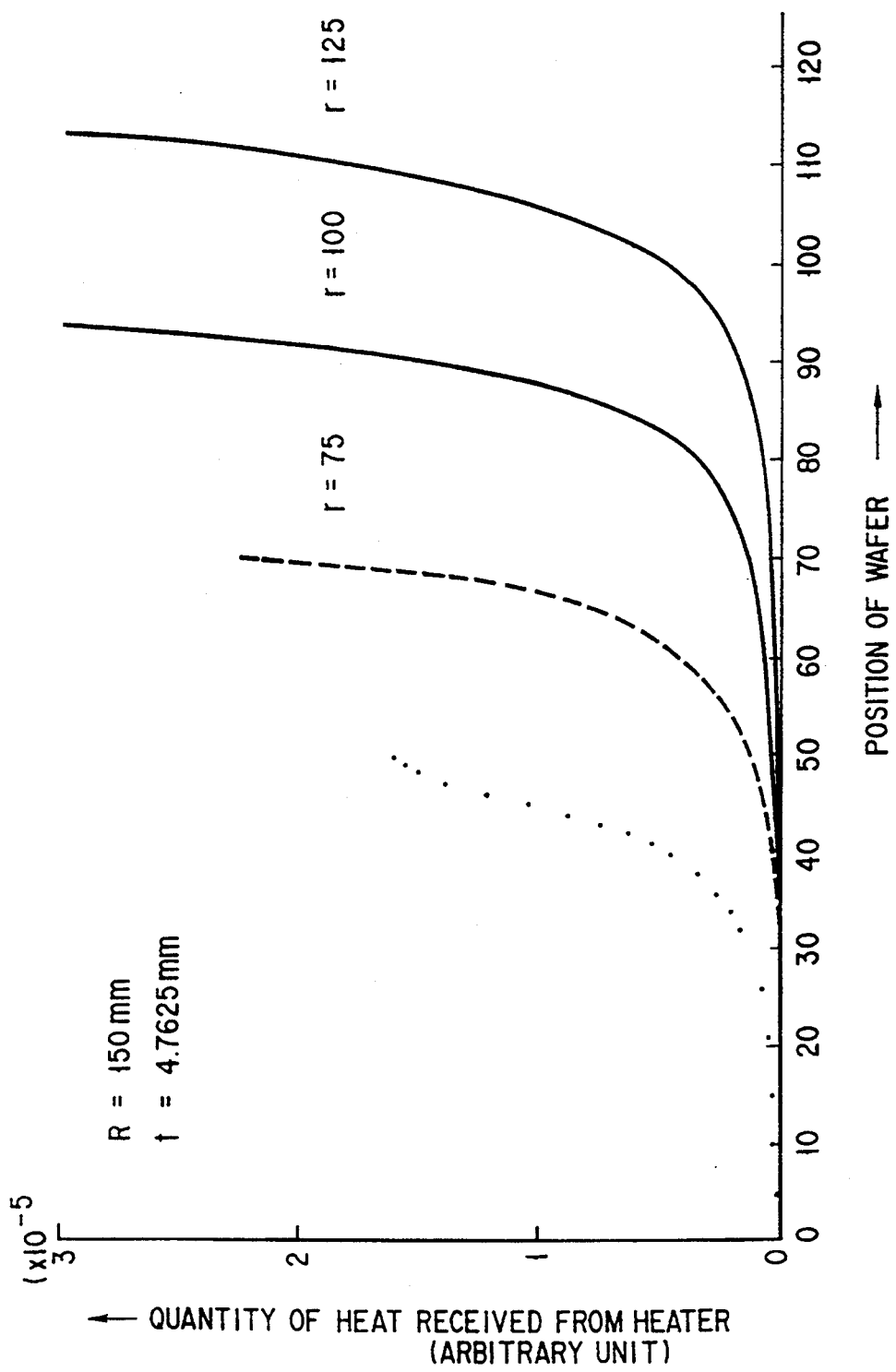
FIG. 9 is a characteristic diagram showing calculated results of quantity of heat received at the positions of a wafer with a distance r from the center of the wafer to the edge of the wafer used as a parameter.

FIG. 9 shows the calculated results of the quantity of heat received at the points of the wafer with the diameter of the wafer, i.e., the distance r from the center of the wafer to the edge of the wafer to be used as a parameter in such a manner that the radius R of the heater and the interval t of the wafers are constant. It is understood from the curves in FIG. 9 that, when the radius r of the wafer is small in terms of the radius R of the heater, the degree of an increase in the quantity of heat received at the edge of the wafer is small and the width of the range of the quantity of heat received at the wafer is narrow.

Figure 10:
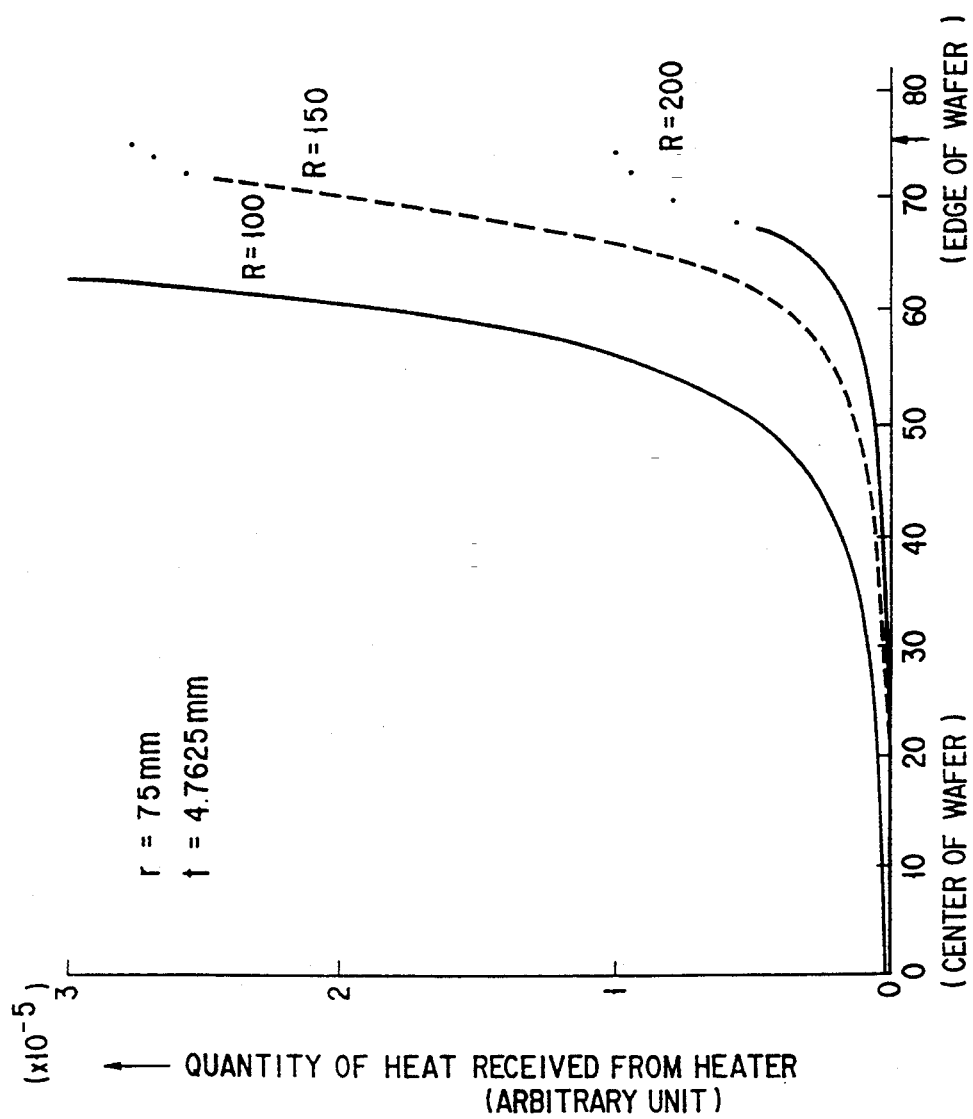
FIG. 10 is a characteristic diagram showing the calculated result of quantity of heat received at the points of a wafer with the diameter (Radius) R of a heater used as a parameter.

FIG. 10 similarly shows curves of the results calculated with the radius R of the heater to be as a parameter in the case where the radius r of the wafer and the interval t of the wafers are constant. It is understood from the curves in FIG. 10 that, as the radius R of the heater is increased, an increase in the quantity of heat received at the edge of the wafer from the heater is decreased and the width of the increase in the quantity of heat received at the wafer is narrow.

Then, the calculated results with the interval t of the wafers to be used as a parameter in such a manner that the radius R of the heater and the radius r of the wafer is constant are shown in FIG. 6. It is understood from the curves in FIG. 6 that, the wider the interval of the wafers is, the quantity of heat received at the wafer is reduced smoothly toward the center of the wafer.

FIG. 11 shows the lower limits of the temperature differences on the surface of the wafer which is not yet patterned but in which a slip is to occur as plotted as the function of the temperature at the center of the wafer. It is understood from the curves in FIG. 11 that, the higher the temperature at the center of the wafer is, a slip occurs at smaller temperature difference on the surface of the wafer from the inner periphery thereof to the outer periphery thereof. This means that the decrease in the breakdown stress of a single crystalline silicon is reflected by the temperature. Incidentally, the lower limits of the temperature differences on the surface of the wafer from the inner periphery thereof to the outer periphery thereof where a slip occurs at 700°, 800° and 900° C. are respectively 65°, 45° and 33° C.

Figure 12:
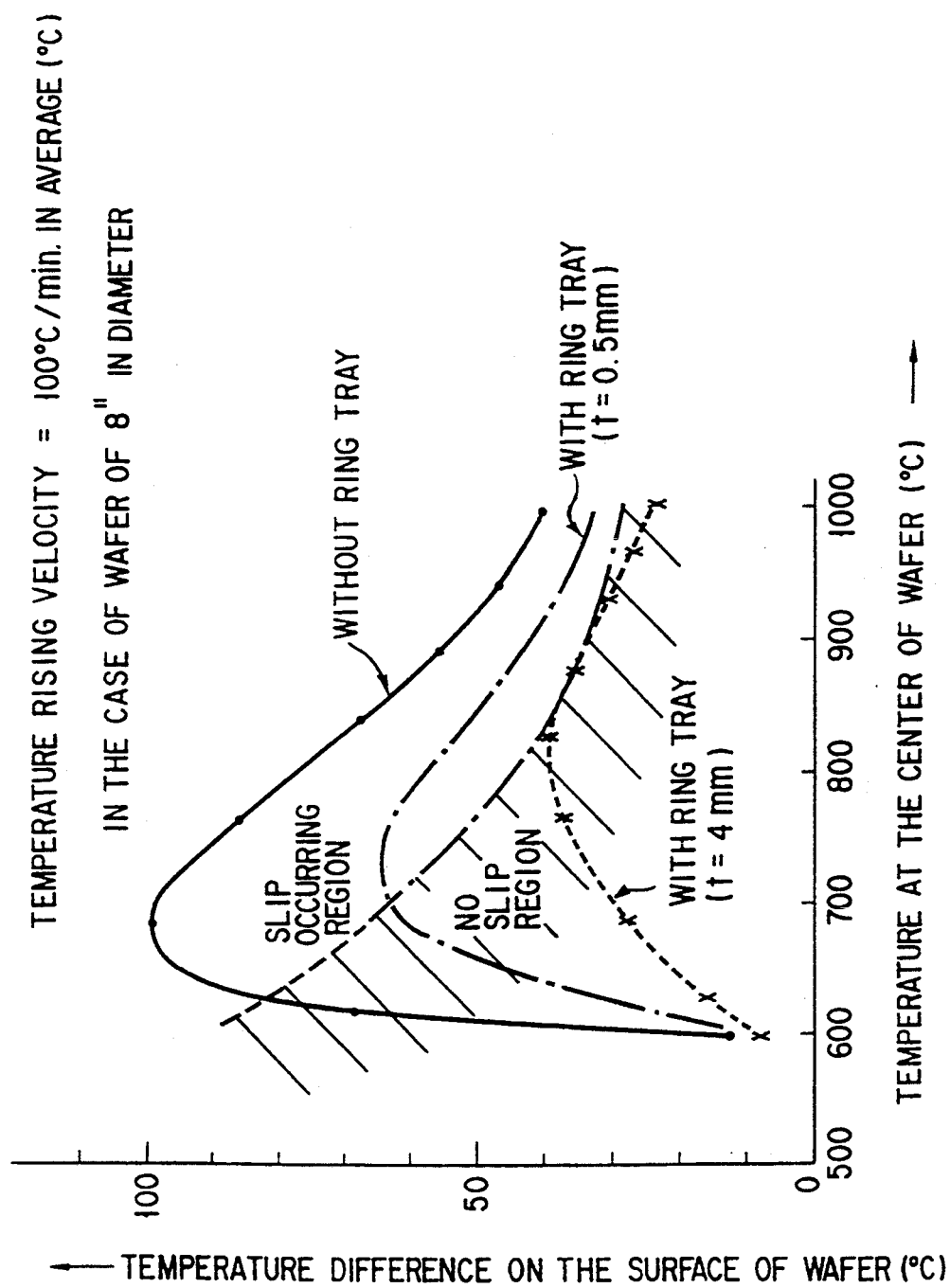
FIG. 12 is a diagram showing temperature differences on the surface of a wafer to the central temperature of the wafer when heated at 100° C./min of average temperature rising velocity to be plotted.

Then, when the temperature differences on the surface of the wafer from the temperature at the center of the wafer when the wafer was heated at the average temperature rising velocity of 100° C./min. from 600° to 1,000° C. by using a wafer supporting method of the same boat as that of the conventional vertical furnace were plotted, they are as shown by curves in FIG. 12. It is understood from the curves in FIG. 12 that, when the temperature at the center of the wafer became about 630° C., the temperature difference for causing a slip to occur in the wafer was already taken place on the wafer. After the maximum temperature difference occurred on the surface of the wafer at the temperature near 700° C., the temperature difference on the surface of the wafer was reduced, though it still remained in the slip occurring region.

Figure 13:
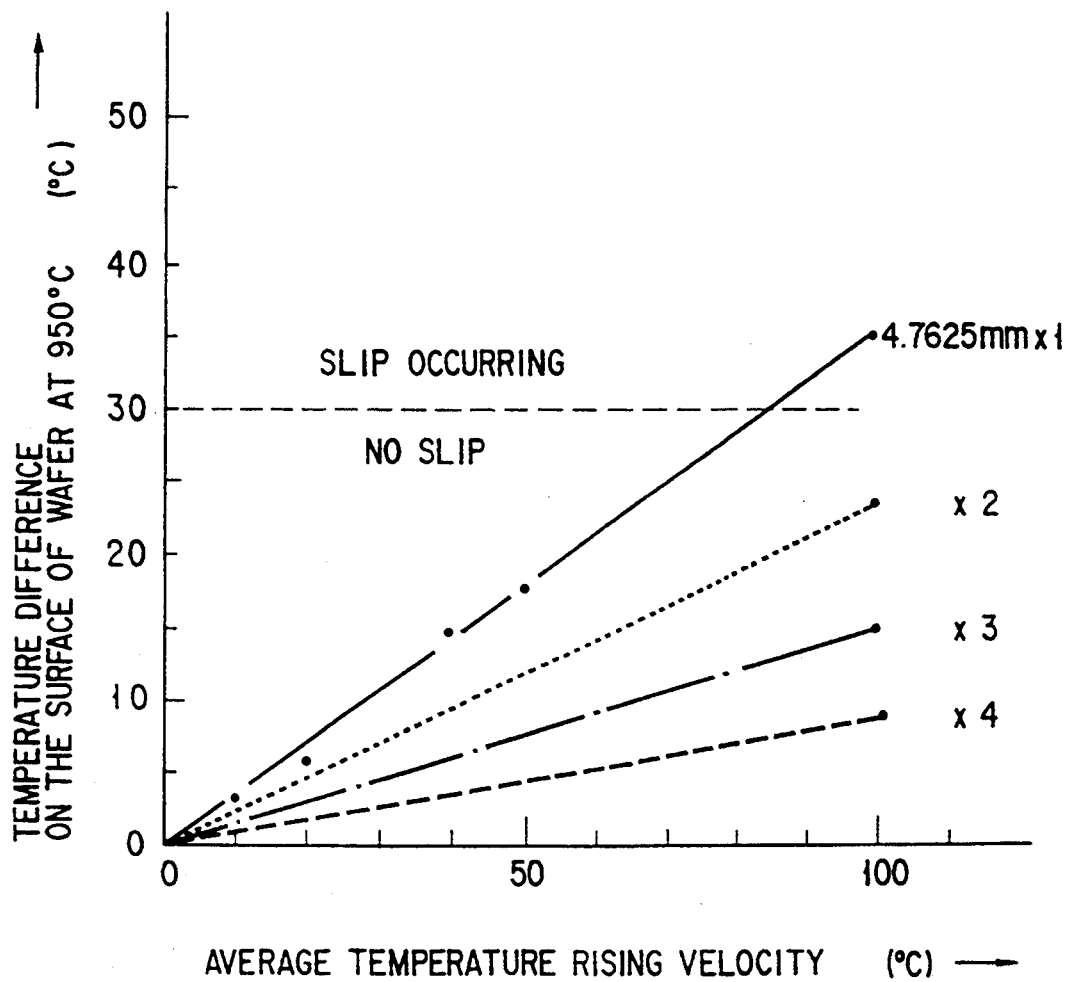
FIG. 13 is a characteristic diagram obtained experimentally, showing a temperature difference on the surface of a wafer at 950° C. to various average temperature rising velocities; a ring-shaped tray having a predetermined thickness is provided in the vicinity of the edge of the wafer.

If the temperature rising velocity is low, it is presumed that the heat diffusion in the silicon wafer becomes effective and the temperature difference on the surface of the wafer is reduced. Then, when the temperature differences on the surface of the wafer at the time of 950° C. were obtained experimentally in terms of various average temperature rising velocities, the temperature differences on the surface of the wafer was increased as shown in FIG. 13 so as to be proportional to the average temperature rising velocity, and when the temperature rising velocity exceeded 85° C./min., the temperature difference on the surface of the wafer exceeded the lower limit of the temperature difference on the surface of the wafer where a slip is to occur, and the slip occurred.

On the other hand, it is understood that, when the intervals of the wafers are increased from 4.7625 mm to twice, three times and four times, the temperature differences on the surface of the wafer is reduced, as presumed from the calculated results of FIG. 6, and the occurrence of the slip was suppressed already at the twice. In this case, it is assumed that the lower limit of the temperature difference on the surface of the wafer where a slip is to occur, is 30° C. on the basis of the experimental results of the wafer which is not yet patterned as shown in FIG. 11. However, it is natural in the process of forming integrated circuits that a nitride film, and/or an oxide film are already patterned on the surface of the silicon wafer in most cases, that a silicon oxide film having a largely different thermal expansion coefficient from that of a silicon substrate is intruded into the silicon substrate in a LOCOS, and that the state in which a slip tends to feasibly occur is frequently situated according to the state of the above-described experiment. Therefore, it is further necessary to set the lower limit of the temperature difference on the surface of the wafer to further lower value in the actual design of the heat treating apparatus used for a manufacturing process of integrated circuits. It is normally sufficient to set the lower limit of the temperature difference on the surface of the wafer to 10° C. In this case, in order to realize 100° C./min. of the temperature rising velocity, it is necessary to obtain 4 times of the interval of the wafers aligned in parallel with each other. Therefore, it causes a productivity to be remarkably reduced.

When a ring-shaped tray having a predetermined thickness as shown in FIG. 7 is provided in the vicinity of the edge of a wafer, the heat capacity G of the equation (2) of the wafer can be increased in the region. Therefore, even if the quantity of heat $\delta P$ received by the wafer for extremely short time at a high temperature rising velocity is increased at the periphery of the wafer, the excessive temperature rise due to the large G can be suppressed and hence the temperature difference on the surface of the wafer can be reduced. As a result, occurrence of a slip in the wafer can also be suppressed.

If the temperature rising velocity is now larger than the heat transfer in the silicon wafer and the quantity of heat $\delta P$ per unit time as shown, for example, in FIG. 7 is supplied to the wafer from the heater, the temperature rises $\delta T$ at the points of the wafer having micro widths depends upon the heat capacities G of the points on the wafer as by the equation (2). If the ring-shaped trays are provided at the peripheries of the wafers, the heat capacities of the points of the wafers in contact with the ring-shaped trays are increased in the quantity of heat capacity of the ring-shaped tray. It is assumed now that the shape of the ring-shaped tray is, as shown in FIG. 7, such that the thickness t and the width d of the ring-shaped tray are constant.

Figure 15A:
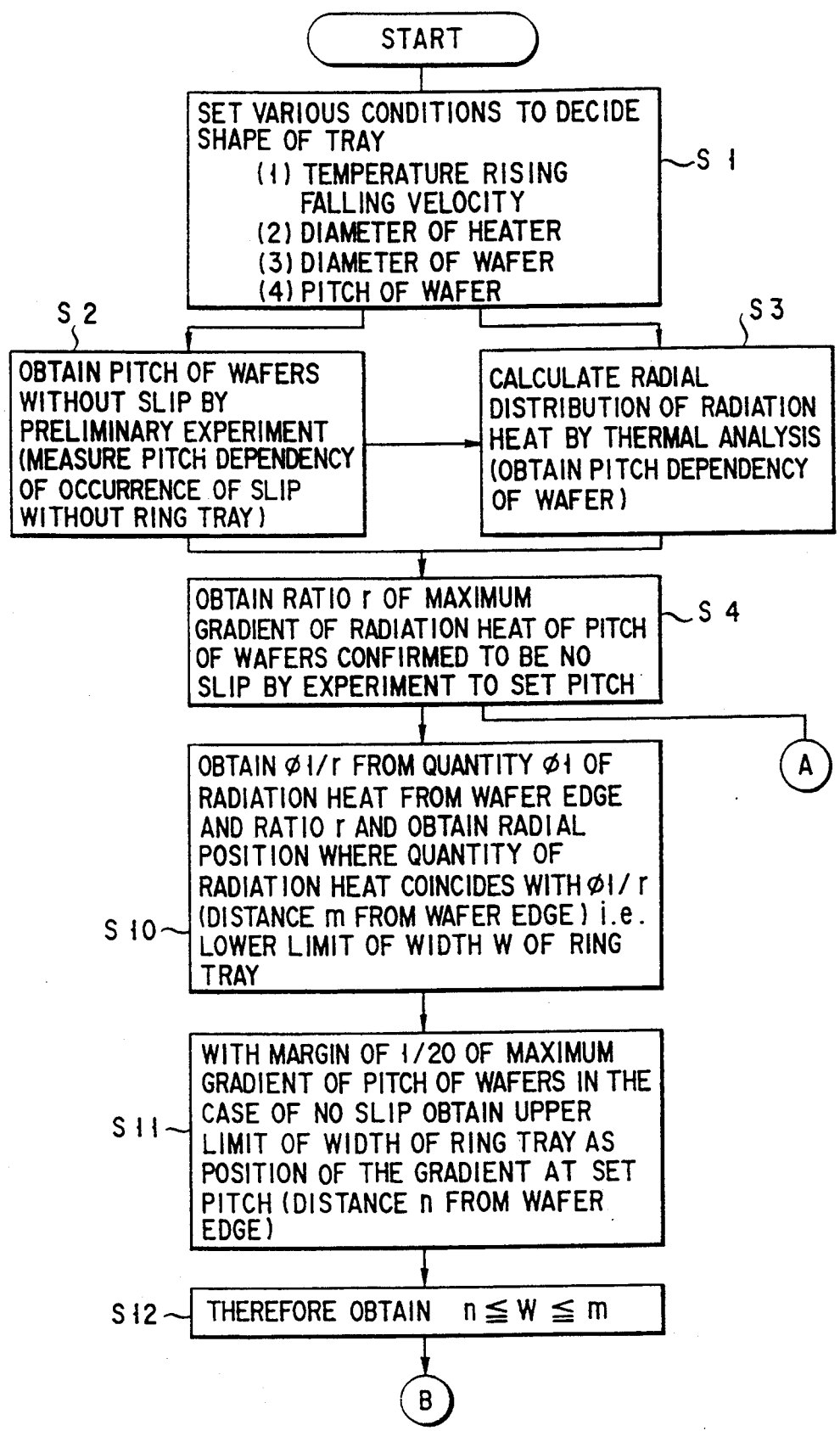
FIG. 15A is a flow chart for explaining determination of the shape of a ring-shaped tray.
Figure 15B:
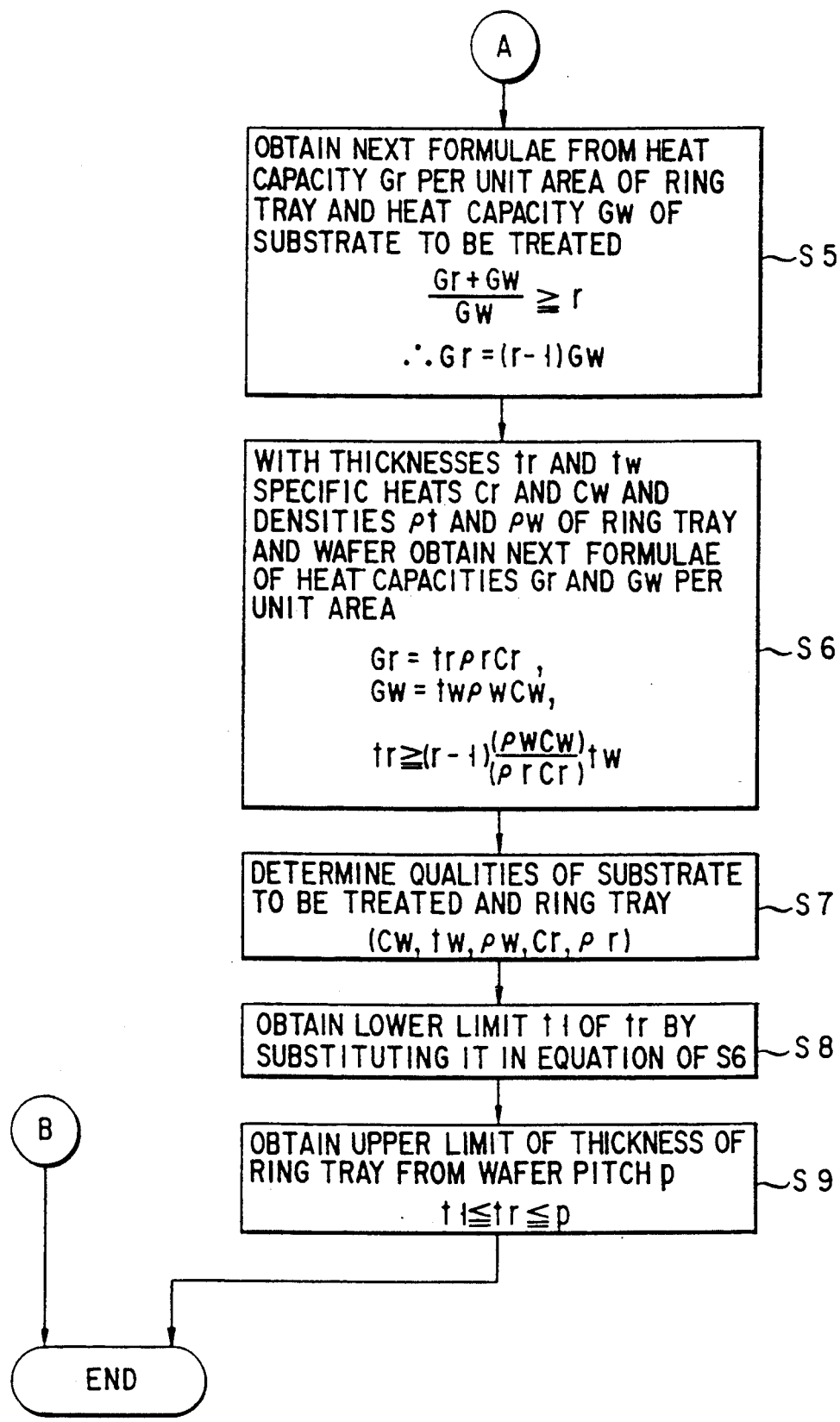
FIG. 15B is a flow chart for explaining determination of the shape of a ring-shaped tray.

A method of determining the shape of a ring-shaped tray having a predetermined constant thickness will be described with reference to flow charts in FIGS. 15A and 15B.

(a) First, in step S1, various conditions for designing to be performed are set. For example, 100° C. of a temperature rising velocity, 300 mm of diameter of a heater (150 mm of radius), 150 mm of diameter of a wafer (75 mm of radius), and 4.7625 mm of a pitch of wafers (one times pitch or interval of wafers) are initially set.

(b) Then, in step S2, a heat treating apparatus having no ring-shaped tray is heated as a preliminary experiment under the designing conditions in the step S1, and the presence or absence of a slip is obtained as the pitch of the wafers to be used as a parameter. For example, it is assumed to be NG (No Good) in the case of three times pitch (14.2875 mm) and OK (allowed) in the case of four times pitch (19.050 mm).

Figure 14:
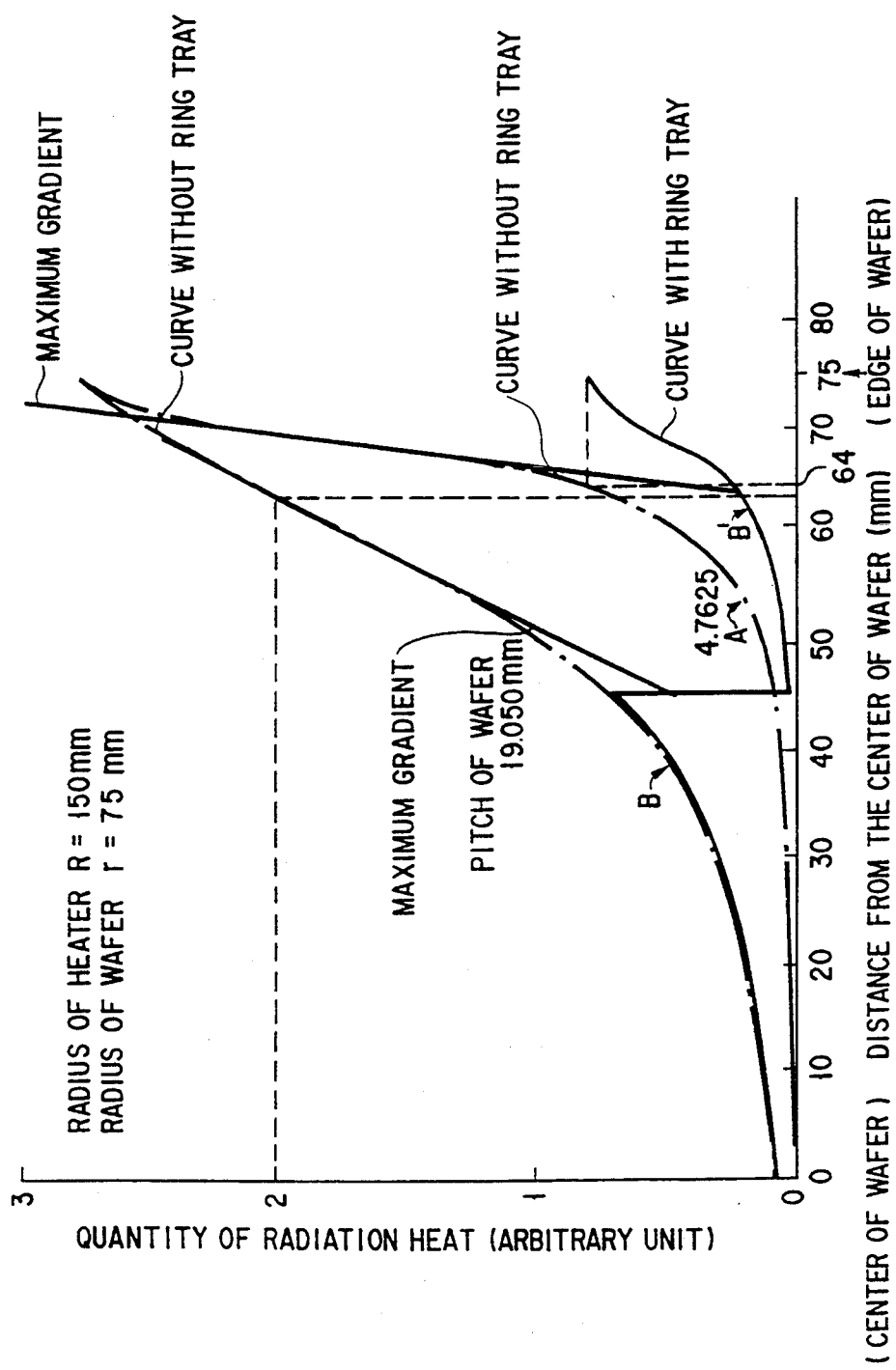
FIG. 14 is a diagram showing the calculated value of quantity of heat of a wafer received by a heater at the times of single pitch and four times of pitch.

(c) Then, in step S3, the radial distribution of the quantity of radiation heat from the heater is obtained by the simulation of a computer with the pitch of the wafers to be as a parameter as shown in FIG. 14. The curves A and B in FIG. 14 are the radial distributions of the quantities of radiation heat in the cases of one times and four times pitch of the wafers. The result of 4.7624 mm of the pitch of the wafers in FIG. 14 is the distribution of the quantity of radiation heat, and converted to the temperature distribution according to the heat capacities of the regions. Therefore, in order to make the temperature distribution on the surface of the wafer uniform, the ratio of the heat capacities of the wafer including the ring-shaped tray must accord with that as shown in FIG. 14 in the radial direction of the wafer.

For the simplicity of the shape of the ring-shaped tray, the temperature distribution on the surface of the tray may be improved by forming the shape of the ring-shaped tray oblique or stepwise. Of course, the uniformity of the temperature distribution on the surface of the tray is enhanced by forming the ring-shaped tray in shape reflected faithfully by the shape as shown in FIG. 14. The simplest shape of the ring-shaped tray is a uniformly thick ring-shaped tray.

(d) Subsequently, the procedure of determining the shape of the uniformly thick ring-shaped tray will be described. First, the procedure of obtaining the preferable thickness of the ring-shaped tray will be described. In step S4, the ratio 4 of the maximum gradient of one times pitch of wafers to be performed to four times pitch of the wafers which has been confirmed in the experiment that no slip occurred is first obtained from the result of FIG. 14. In FIG. 14, r=3.5 is obtained. The value of the r means as below. The maximum gradient of the above-described curve corresponds to the quantity of heat of the maximum temperature difference on the surface of the wafer, and the value of the r corresponds to the ratio of the maximum temperature difference on the surface of the wafer of four times pitch of the wafers to the one times pitch of the wafers.

(e) Then, in step S5, a ring-shaped tray having heat capacity of 3.5 times or more of that of only the wafer, i.e., 2.5 times or more of those of the wafer and the ring-shaped tray is provided, the distribution of the quantity of radiation heat in the case of 4.7625 mm of the pitch of the wafers as shown in FIG. 14 is received, and the quantity of radiation heat received thereby is improved as illustrated by the curve of the broken line in FIG. 7. More specifically, the temperature rise per unit time is similarly improved. Since no slip occurs in the wafers disposed at the four times pitch even at the position corresponding to the maximum gradient, i.e., the position where the maximum temperature difference is provided on the surface of the wafer, if the position corresponding to the maximum gradient in the case of one times pitch of the wafers is formed to be the maximum gradient of the case of four times pitch of the wafers, no slip occurs in the wafers aligned at one times pitch of the wafers. As described above, the temperature rise is suppressed in the region near the edge of the wafer, and the gradient of the position of the wafer is reduced.

(f) Then, in step S6, in order to obtain the thickness of the ring-shaped tray, the thicknesses, the specific heats and the densities of the wafer and the ring-shaped tray are respectively denoted by tw and tr, Cw and Cr, and $\rho w$ and $\rho r$. Then, the tr is obtained by the following equation (5):

$$tr = (r-1) \cdot (\rho w Cw) tw / \rho r Cr \quad (5)$$

(g) In step S7, when the wafer is formed, for example, of silicon and the ring-shaped tray is formed of quartz, the thicknesses, the specific heats and the densities of the wafer and the ring-shaped tray may be determined as below.

$tw = 625 \ \mu m, \ Cw = 0.7 \ cal/g°Ccm^3 \ \rho w = 2.33 \ g$ $Cr = 1.0 \ cal/g°Ccm^3 \ \rho w = 2.27 \ g$ (h) In step S8, the lower limit tl of the tr is obtained as 1.1 mm by substituting it in the equation (5).

(i) Since the ring-shaped trays are mounted between the wafers, the pitch of the wafers corresponds in principle to the maximum thickness of the ring-shaped tray. Therefore, in step S9, the preferable thickness of the ring-shaped tray is obtained as below.

1.1 mm ≦ thickness ≦ pitch of wafers (j) Then, the procedure of obtaining the preferable width of the ring-shaped tray will be described. First, in step S10, the ratio $\phi 1/r$ of the the quantity of radiation heat $\phi 1$ at the edge of the wafer to the ratio r is obtained from the quantity of radiation heat $\phi 1$ and the ratio r from the calculated results in FIG. 14, and the radial position, where the quantity of radiation heat coincides with the ratio $\phi 1/r$ in curve A, is obtained from the result of FIG. 14. In FIG. 14, since the $\phi 1$ is 2.8 and the r is 3.5, the quantity of radiation heat $\phi = \phi 1/r = 0.8$ is obtained. It is necessary to set the width of the ring-shaped tray so that the quantity of radiation heat becomes at least $\phi = 0.8$ or less. The position where the quantity of radiation heat $\phi$ becomes 0.8 is disposed 64 mm from the center (11 mm from the edge of the wafer) from FIG. 14. Therefore, the lower limit n of the width of the ring-shaped tray must be 11 mm.

(k) Then, in step S11, the margin is set at the position where the gradient is 1/20 of the maximum gradient in the case of four times pitch of the wafers. The position is 40 mm from the center of the wafer from FIG. 14. Therefore, the upper limit m of the width of the ring-shaped tray is 35 mm.

(l) Eventually, in step S12, in summary, the following relationship is obtained:

n (11 mm) ≦ width W ≦ m (35mm)

It is preferable that the width W of the ring-shaped tray is as near as the value m obtained in the step S10 and that the margin is ¼ or more preferably ½ of the maximum gradient.

The present invention is not limited to the particular embodiments described above. In the embodiments described above, the material of the ring-shaped tray is formed of the quartz. However, the ring-shaped tray may also be formed, for example, of not only a single crystalline silicon, a polycrystalline silicon, but also silicon nitride or silicon carbide so as to be performed in the same manner as the embodiments described above. Further, the diameter of the wafer is not limited to 6 inches, but various diameters may also be applied. At present, 8 inches of a wafer is, for example, discussed in silicon integrated circuits. In order to reduce the cost of the manufacturing process of the wafer, a trend of increasing the diameter of the wafer is continuously developed. Therefore, since the variation in the quantity of radiation heat in the radial direction of the silicon wafer according to the present invention is similarly altered, the shape of the ring-shaped tray may be similarly altered in accordance with the trend of an increase in the diameter of the ring-shaped tray.

In the embodiments described above, the method of varying the difference of the heat capacity of the ring-shaped tray according to the thickness of the quartz glass has been described. However, the difference of the heat capacity may also be performed instead by the variations in the material such as silicon nitride, silicon carbide. Moreover, the substrate to be treated is not limited to the silicon wafer, but the present invention may also be applied similarly to other semiconductor wafers and glass substrates.

Various modifications may be made without departing from the spirit or scope of the general inventive concept of the present invention.

According to the embodiments of the present invention, as described in detail above, temperature difference in the radial direction of the substrate to be treated at the temperature rising and falling times can be reduced by providing the difference of heat capacities in the radial direction of the substrate to be treated. Therefore, the temperature rising and falling velocities of the substrate to be treated before and after desired heat treatments may be accelerated without occurrence of a crystal defect and/or a slip. As a result, not only a throughput is increased, but also a parasitic effect of excessive heat treating steps at the temperature rising and falling times such as an elongation of a diffused layer may be suppressed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A heat treatment apparatus for performing a heat treatment by raising and lowering a temperature of a plurality of substrates comprising:
   a plurality of substantially continuous ring-shaped trays;
   each of said ring-shaped trays including a ring-shaped support surface which supports a periphery of a substrate thereon, each of said ring-shaped trays further including a ring-shaped projection extending about said ring-shaped support surface and extending upwardly from said ring-shaped support surface, and further wherein a ring-shaped gap is provided between an inner periphery of the ring-shaped projection and an outer periphery of the substrate supported on the ring-shaped support surface;
   wherein said ring-shaped support surface has a larger thickness at a location adjacent said ring-shaped projection as compared with a thickness of said ring-shaped support surface at a location farther from said ring-shaped projection, such that the thickness of the ring-shaped trays is thinner at radially inner portions of said ring-shaped support surface.

2. The apparatus according to claim 1, wherein the ring-shaped trays are made of quartz.

* * * * *